United States Patent
Ohyama et al.

(10) Patent No.: US 10,082,700 B2
(45) Date of Patent: *Sep. 25, 2018

(54) ANTIREFLECTION FILM AND ORGANIC LIGHT EMITTING DIODE DEVICE INCLUDING THE SAME

(71) Applicant: SAMSUNG ELECTRONICS CO., LTD., Suwon-si, Gyeonggi-do (KR)

(72) Inventors: Tsuyoshi Ohyama, Suwon-si (KR); Koh Kamada, Suwon-si (KR); Eun Sung Lee, Gyeonggi-do (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 120 days.

This patent is subject to a terminal disclaimer.

(21) Appl. No.: 14/757,849

(22) Filed: Dec. 28, 2015

(65) Prior Publication Data

US 2016/0211486 A1 Jul. 21, 2016

(30) Foreign Application Priority Data

Dec. 26, 2014 (KR) .......... 10-2014-0190805

(51) Int. Cl.
| | | |
|---|---|---|
| G02F 1/13363 | (2006.01) | |
| G02B 1/11 | (2015.01) | |
| G02B 5/30 | (2006.01) | |
| H01L 51/52 | (2006.01) | |
| G02F 1/1335 | (2006.01) | |

(52) U.S. Cl.
CPC .......... *G02F 1/13363* (2013.01); *G02B 1/11* (2013.01); *G02B 5/3016* (2013.01); *G02F 1/133634* (2013.01); *G02F 1/133528* (2013.01); *H01L 51/5281* (2013.01)

(58) Field of Classification Search
CPC .......... G02F 1/13363; G02F 1/133528; G02F 2001/133635; G02F 2001/133638; G02B 1/11; G02B 5/30
See application file for complete search history.

(56) References Cited

U.S. PATENT DOCUMENTS

| | | |
|---|---|---|
| 7,175,889 B2 | 2/2007 | Ohkawa et al. |
| 7,190,354 B2 | 3/2007 | Tanaka et al. |
| 7,190,525 B2 | 3/2007 | Ito et al. |
| 7,202,922 B2 | 4/2007 | Ito |
| 7,336,857 B2 | 2/2008 | Kawahara et al. |

(Continued)

FOREIGN PATENT DOCUMENTS

| | | |
|---|---|---|
| JP | 3325560 B2 | 9/2002 |
| JP | 2010522892 A | 7/2010 |

(Continued)

OTHER PUBLICATIONS

Korean Search Report dated Sep. 3, 2014 for KR 10-2014-0190805 pp. 1-11.

*Primary Examiner* — Dung Nguyen
(74) *Attorney, Agent, or Firm* — Cantor Colburn LLP

(57) ABSTRACT

An antireflection film includes a polarizer, a first phase delay layer, and a second phase delay layer, where at least one of the first phase delay layer and the second phase delay layer includes a liquid crystal layer, and the liquid crystal layer includes liquid crystals oriented in a direction tilting obliquely with respect to a surface thereof.

25 Claims, 9 Drawing Sheets

(56) References Cited

U.S. PATENT DOCUMENTS

| | | | |
|---|---|---|---|
| 7,625,612 B2* | 12/2009 | Ohmori | C08J 5/18 |
| | | | 349/118 |
| 7,852,561 B2* | 12/2010 | Chiba | G02B 5/3033 |
| | | | 349/119 |
| 8,119,026 B2 | 2/2012 | Parri et al. | |
| 8,425,991 B2 | 4/2013 | Nimura et al. | |
| 8,512,824 B2 | 8/2013 | Kasianova et al. | |
| 8,574,689 B2 | 11/2013 | Shin et al. | |
| 8,687,259 B2 | 4/2014 | Adlem et al. | |
| 9,583,543 B2* | 2/2017 | Kamada | H01L 27/3232 |
| 9,627,655 B2* | 4/2017 | Yaginuma | H01L 51/5281 |
| 2006/0246232 A1 | 11/2006 | Kubo et al. | |
| 2008/0180608 A1* | 7/2008 | Ishizaki | C08J 7/18 |
| | | | 349/106 |
| 2009/0002609 A1* | 1/2009 | Okita | G02F 1/13363 |
| | | | 349/98 |
| 2011/0317101 A1 | 12/2011 | Cho et al. | |
| 2012/0108781 A1 | 5/2012 | Adlem et al. | |
| 2013/0140587 A1 | 6/2013 | Lim et al. | |
| 2017/0212288 A1* | 7/2017 | Ohyama | G02B 5/3016 |

FOREIGN PATENT DOCUMENTS

| | | |
|---|---|---|
| JP | 4548726 B2 | 9/2010 |
| JP | 2012007160 A | 1/2012 |
| JP | 2012035445 A | 2/2012 |
| JP | 5079150 B2 | 11/2012 |
| JP | 5115495 B2 | 1/2013 |
| JP | 2013114141 A | 6/2013 |
| KR | 1020040025862 A | 3/2004 |
| KR | 1020050070609 A | 7/2005 |
| KR | 1020050070616 A | 7/2005 |
| KR | 1020070097438 A | 10/2007 |
| KR | 1020120055129 A | 5/2012 |
| KR | 1020130078727 A | 7/2013 |
| KR | 1020140088720 A | 7/2014 |
| KR | 1020140093500 A | 7/2014 |

* cited by examiner

ANTIREFLECTION FILM AND ORGANIC LIGHT EMITTING DIODE DEVICE INCLUDING THE SAME

CROSS-REFERENCE TO RELATED APPLICATIONS

This application claims priority to Korean Patent Application No. 10-2014-0190805 filed on Dec. 26, 2014, and all the benefits accruing therefrom under 35 U.S.C. § 119, the content of which in its entirety is herein incorporated by reference.

BACKGROUND

1. Field

Embodiments relate to an antireflection film and an organic light emitting diode device including the antireflection film.

2. Description of the Related Art

Recently, as demand for a light and thin display device, e.g., a monitor, a television, or the like, increases, an organic light emitting diode device ("OLED device") has drawn attention. The organic light emitting diode device operates without a separate backlight as a self-light emitting display device, and thus may be used to realize a thin and flexible display device.

In the organic light emitting device, external light may be reflected by a metal electrode and a metal line of the organic light emitting display panel, and the visibility and the contrast ratio may be deteriorated by reflection of the exterior light, thereby reducing display quality. Accordingly, a circular polarizing plate is typically attached to a surface of an organic light emitting display panel to reduce the reflection of the exterior light, and thus leakage of the reflected external light to the outside may be reduced.

SUMMARY

A conventional circular polarizing plate typically has strong viewing angle dependency, such that visibility may be deteriorated toward a side when such conventional circular polarizing plate is applied to an organic light emitting diode device to reduce reflection of exterior light.

Embodiments provide an antireflection film having improved display characteristics with reduced viewing angle dependency:

Embodiments provide an organic light emitting diode device including the antireflection film.

According to an embodiment, an antireflection film includes a polarizer, a first phase delay layer, and a second phase delay layer, where at least one of the first phase delay layer and the second phase delay layer includes a liquid crystal layer, and the liquid crystal layer includes liquid crystals oriented in a direction tilting obliquely with respect to a surface thereof.

In an embodiment, the liquid crystal layer may include a first surface and a second surface opposite to the first surface, and tilt angles of the liquid crystals may become gradually increased from the first surface to the second surface.

In an embodiment, a maximum tilt angle of the liquid crystals may be in a range from about 30 degrees to about 75 degrees.

In an embodiment, a tilt angle of the liquid crystals near the first surface may be greater than about zero degree (0°) and less than or equal to about 5 degrees.

In an embodiment, the at least one of the first phase delay layer and the second phase delay layer may further include an alignment layer contacting the first surface of the liquid crystal layer.

In an embodiment, in-plane retardation ($R_{e2}$) of the liquid crystal layer for about 450 nm, about 550 nm and about 650 nm wavelengths may satisfy the following inequations: $0.95 \leq R_{e2}$ (450 nm)/$R_{e2}$ (550 nm); and $0.95 \leq R_{e2}$ (550 nm)/$R_{e2}$ (650 nm), where $R_{e2}$ (450 nm) denotes in-plane retardation of the liquid crystal layer for incident light of about 450 nm wavelength, $R_{e2}$ (550 nm) denotes in-plane retardation the liquid crystal layer for incident light of about 550 nm wavelength, and $R_{e2}$ (650 nm) denotes in-plane retardation of the liquid crystal layer for incident light of about 650 nm wavelength.

In an embodiment, wavelength dispersion of the liquid crystal layer may satisfy the following inequation: $1.0 \leq R_{e2}$ (450 nm)/$R_{e2}$ (550 nm) $\leq 1.2$, where $R_{e2}$ (450 nm) denotes in-plane retardation of the liquid crystal layer for incident light of about 450 nm wavelength, and $R_{e2}$ (550 nm) denotes in-plane retardation of the liquid crystal layer for incident light of about 550 nm wavelength.

In an embodiment, in-plane retardation ($R_{e0}$) of a combination of the first phase delay layer and the second phase delay layer for about 450 nm, about 550 nm and about 650 nm wavelengths may satisfy the following inequation: $R_{e0}$ (450 nm) $\leq R_{e0}$ (550 nm) $\leq R_{e0}$ (650 nm), where $R_{e0}$ (450 nm) denotes in-plane retardation of the combination of the first phase delay layer and the second phase delay layer for incident light of about 450 nm wavelength, $R_{e0}$ (550 nm) denotes in-plane retardation of the combination of the first phase delay layer and the second phase delay layer for incident light of about 550 nm wavelength, and $R_{e0}$ (650 nm) denotes in-plane retardation of the combination of the first phase delay layer and the second phase delay layer for incident light of about 650 nm wavelength.

In an embodiment, short wavelength dispersion of a combination of the first phase delay layer and the second phase delay layer may satisfy the following inequation: $0.7 \leq R_{e0}$ (450 nm)/$R_{e0}$ (550 nm) $\leq 1.0$, where $R_{e0}$ (450 nm) denotes in-plane retardation of the combination of the first phase delay layer and the second phase delay layer for incident light of about 450 nm wavelength, and $R_{e0}$ (550 nm) denotes in-plane retardation of the combination of the first phase delay layer and the second phase delay layer for incident light of about 550 nm wavelength.

In an embodiment, an angle ($\theta_a$) between an optical axis of the first phase delay layer and an optical axis of the polarizer and an angle ($\theta_b$) between an optical axis of the second phase delay layer and an optical axis of the polarizer may satisfy the following equation: $\theta_b = 2\theta_a + 45°$.

In an embodiment, one of the first phase delay layer and the second phase delay layer may be $\lambda/2$ phase delay layer, and the other of the first phase delay layer and the second phase delay layer may be $\lambda/4$ phase delay layer.

In an embodiment, the first phase delay layer may be a $\lambda/2$ phase, delay layer, and the second phase delay layer may be a $\lambda/4$ phase delay layer.

In an embodiment, the second phase delay layer may include the liquid crystal layer.

In an embodiment, the first phase delay layer may have a refractive index that simultaneously satisfies the following inequations: $n_{x1} > n_{y1}$; and $n_{x1} > n_{z1}$, where $n_{x1}$ denotes a refractive index at a slow axis of the first phase delay layer, $n_{y1}$ denotes a refractive index at a fast axis of the first phase delay layer, and $n_{z1}$ denotes a refractive index in a direction perpendicular to the slow and fast axes of the first phase delay layer.

In an embodiment, the first phase delay layer may include an elongated polymer layer.

The antireflection film may include the polarizer, the first phase delay layer disposed on the polarizer, and the second phase delay layer disposed between the polarizer and the first phase delay layer.

The antireflection film may include the polarizer, the first phase delay layer, and the second phase delay stacked sequentially.

According to another embodiment, an organic light emitting diode device includes an organic light emitting display panel and an antireflection film including a polarizer, a first phase delay layer disposed on the polarizer, and a second phase delay layer disposed between the polarizer and the first phase delay layer, where at least one of the first phase delay layer and the second phase delay layer includes a liquid crystal layer including liquid crystals oriented in a direction tilting obliquely with respect to a surface thereof.

In an embodiment, the liquid crystal layer may include a first surface and a second surface opposite to the first surface, and tilt angles of the liquid crystals may become gradually increased from the first surface to the second surface.

In an embodiment, the first surface of the liquid crystal layer may be disposed closer to the polarizer than the organic light emitting display panel, and the second surface of the liquid crystal layer may be disposed closer to the organic light emitting display panel than the polarizer.

In an embodiment, a maximum tilt angle of the liquid crystals may be in a range from about 30 degrees to about 75 degrees.

In an embodiment, a tilt angle of the liquid crystals near the first surface may be greater than about zero degree (0°) and less than or equal to about 5 degrees.

In an embodiment, the at least one of the first phase delay layer and the second phase delay layer may further include an alignment layer contacting the first surface of the liquid crystal layer.

In an embodiment, in-plane retardation ($R_{e2}$) of the liquid crystal layer for about 450 nm, about 550 nm and about 650 nm wavelengths may satisfy the following inequations: $0.95 \leq R_{e2}$ (450 nm)/$R_{e2}$ (550 nm); and $0.95 \leq R_{e2}$ (550 nm)/$R_{e2}$ (650 nm), where $R_{e2}$ (450 nm) denotes in-plane retardation of the liquid crystal layer for incident light of 450 nm wavelength, $R_{e2}$ (550 nm) denotes in-plane retardation the liquid crystal layer for incident light of 550 nm wavelength, and $R_{e2}$ (650 nm) denotes in-plane retardation of the liquid crystal layer for incident light of 650 nm wavelength.

In an embodiment, wavelength dispersion of the liquid crystal layer may satisfy the following inequation: $1.0 \leq R_{e2}$ (450 nm)/$R_{e2}$(550 nm)$\leq 1.2$, where $R_{e2}$ (450 nm) denotes in-plane retardation of the liquid crystal layer for incident light of 450 nm wavelength, and $R_{e2}$ (550 nm) denotes in-plane retardation of the liquid crystal layer for incident light of 550 nm wavelength.

In an embodiment, in-plane retardation ($R_{e0}$) of a combination of the first phase delay layer and the second phase delay layer for about 450 nm, about 550 nm and about 650 nm wavelengths may satisfy the following inequation: $R_{e0}$ (450 nm)$\leq R_{e0}$(550 nm)$\leq R_{e0}$(650 nm), where $R_{e0}$(450 nm) denotes in-plane retardation of the combination of the first phase delay layer and the second phase delay layer for incident light of 450 nm wavelength, $R_{e0}$ (550 nm) denotes in-plane retardation of the combination of the first phase delay layer and the second phase delay layer for incident light of 550 nm wavelength, and $R_{e0}$ (650 nm) denotes in-plane retardation of the combination of the first phase delay layer and the second phase delay layer for incident light of 650 nm wavelength.

In an embodiment, short wavelength dispersion of a combination of the first phase delay layer and the second phase delay layer may satisfy the following inequation: $0.7 \leq R_{e0}$(450 nm)/$R_{e0}$(550 nm)$\leq 1.0$, where $R_{e0}$ (450 nm) denotes in-plane retardation of the combination of the first phase delay layer and the second phase delay layer for incident light of 450 nm wavelength, and $R_{e0}$ (550 nm) denotes in-plane retardation of the combination of the first phase delay layer and the second phase delay layer for incident light of 550 nm wavelength.

In an embodiment, an angle ($\theta_a$) between an optical axis of the first phase delay layer and an optical axis of the polarizer and an angle ($\theta_b$) between an optical axis of the second phase delay layer and an optical axis of the polarizer may satisfy the following equation: $\theta_b = 2\theta_a + 45°$.

In an embodiment, one of the first phase delay layer and the second phase delay layer may be $\lambda/2$ phase delay layer, and the other of the first phase delay layer and the second phase delay layer may be $\lambda/4$ phase delay layer.

In an embodiment, the first phase delay layer may be a $\lambda/2$ phase delay layer, and the second phase delay layer may be a $\lambda/4$ phase delay layer.

In an embodiment, the second phase delay layer may include the liquid crystal layer.

In an embodiment, the first phase delay layer may have a refractive index that simultaneously satisfies the following inequations: $n_{x1} > n_{y1}$; and $n_{x1} > n_{z1}$, where $n_{x1}$ denotes a refractive index at a slow axis of the first phase delay layer, $n_{y1}$ denotes a refractive index at a fast axis of the first phase delay layer, and $n_{z1}$ denotes a refractive index in a direction perpendicular to the slow and fast axes of the first phase delay layer.

In an embodiment, the first phase delay layer may include an elongated polymer layer.

In an embodiment, the antireflection film may include the polarizer, the first phase delay layer disposed on the polarizer, and the second phase delay layer disposed between the polarizer and the first phase delay layer.

In an embodiment, the antireflection film may include the polarizer, the first phase delay layer, and the second phase delay stacked sequentially.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1:
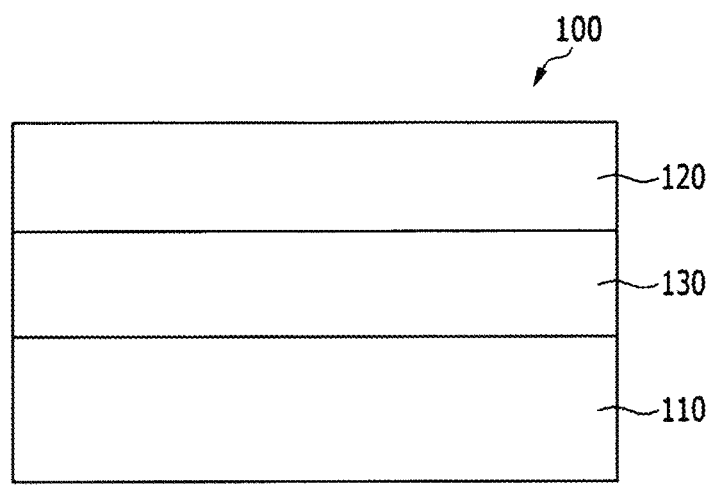
FIG. 1 is a cross-sectional view showing an embodiment of an antireflection film.

The invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example In an exemplary embodiment, if when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, embodiments of the invention will be described referring to the drawings.

Figure 2:
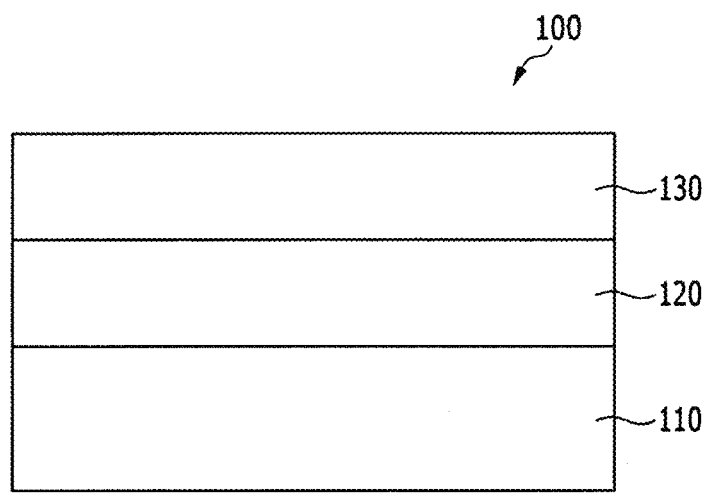
FIG. 2 is a cross-sectional view showing another embodiment of an antireflection film.
Figure 3:
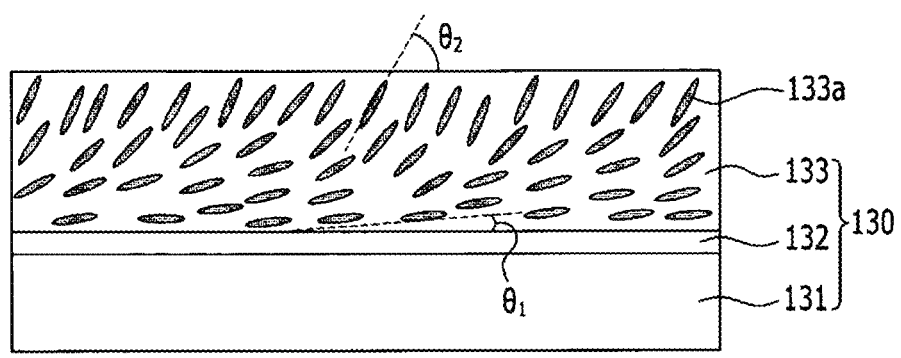
FIG. 3 is a schematic cross-sectional view of an embodiment of a second phase delay layer of the antireflection film in FIG. 1 or 2.

FIG. 1 is a cross-sectional view showing an embodiment of an antireflection film, FIG. 2 is a cross-sectional view showing another embodiment of an antireflection film, and FIG. 3 is a schematic cross-sectional view of an embodiment of a second phase delay layer of the antireflection film in FIG. 1 or 2.

Referring to FIG. 1, an embodiment of an antireflection film 100 includes a polarizer 110, a first phase delay layer 120 disposed on the polarizer 110, and a second phase delay layer 130 disposed between the polarizer 110 and the first phase delay layer 120. In other words, the antireflection film 100 in FIG. 1 includes the polarizer 110, the second phase delay layer 130 and the first phase delay layer 120 stacked sequentially.

Referring to FIG. 2, an embodiment of an antireflection film 100 includes a polarizer 110, a first phase delay layer 120, and a second phase delay layer 130 stacked sequentially.

The polarizer 110 may define a light incident side or surface of the antireflection film, e.g., a side or surface where light enters, and may be a linear polarizer that shifts incident light into linear polarization or polarizes incident light into a linearly polarized light.

In one embodiment, for example, the polarizer 110 may include elongated polyvinyl alcohol ("PVA"). In one embodiment for example, the polarizer 110 may be formed by drawing a PVA film, adsorbing iodine or a dichroic dye to the PVA film, and treating the PVA film with boric acid and washing the treated PVA film.

In one embodiment, for example, the polarizer 110 may include a polarizing film including a melt-blend of a polymer and a dichroic dye, which may be prepared by melt-blending the polymer and the dichroic dye. In one embodiment, for example, the polarizing film may formed by mixing a polymer and a dichroic dye and melting the mixture of the polymer and the dichroic dye at a temperature above the melting point of the polymer to manufacture the polarizing film in a form of a sheet.

In an embodiment, one of the first phase delay layer 120 and the second phase delay layer 130 may be a λ/2 phase delay layer, and the other of the first phase delay layer 120 and the second phase delay layer 130 may be a λ/4 phase delay layer. In one embodiment, for example, the first phase delay layer 120 may be a λ/2 phase delay layer, and the second phase delay layer 130 may be a λ/4 phase delay layer. In one embodiment, for example, the first phase delay layer 120 may be a λ/4 phase delay layer, and the second phase delay layer 130 may be a λ/2 phase delay layer.

In an embodiment, where the first phase delay layer 120 is a λ/2 phase delay layer, the first phase delay layer 120 may have in-plane retardation ($R_{e1}$) in a range of about 240 nanometers (nm) to about 300 nm for incident light of 550 nm (hereinafter, referred to be as 'reference wavelength'). In one embodiment, for example, the first phase delay layer 120 may have in-plane retardation ($R_{e1}$) in a range of about 240 nm to about 280 nm or in a range of about 250 nm to about 280 nm.

Herein, the in-plane retardation ($R_{e1}$) of the first phase delay layer 120 satisfies the following equation; $R_{e1}=(n_{x1}-n_{y1})\times d_1$, where $d_1$ denotes a thickness of the first phase delay layer 120, $n_{x1}$ denotes a refractive index in a direction having the highest refractive index in a plane of the first phase delay layer 120 (hereinafter referred to as "a slow axis"), and $n_{y1}$ denotes a refractive index in a direction having the lowest refractive index in a plane of the first phase delay layer 120 (hereinafter referred to as "a fast axis"). Herein, a refractive index at a fast/slow axis means a refractive index in a direction parallel to the fast/slow axis.

In an embodiment, where the first phase delay layer 120 is a λ/4 phase delay layer, the first phase delay layer 120 may have in-plane retardation ($R_{e1}$) in a range of about 110 nm to about 160 nm for incident light of the reference wavelength. In one embodiment, for example, the first phase delay layer 120 may have in-plane retardation ($R_{e1}$) in a range of about 120 nm to about 150 nm.

The first phase delay layer 120 may have a refractive index that simultaneously satisfies the following Relationships 6 and 7.

$n_{x1}>n_{y1}$           [Relationship 6]

$n_{x1}>n_{z1}$           [Relationship 7]

In Relationships 6 and 7, $n_{x1}$ denotes the refractive index at the slow axis of the first phase delay layer 120, $n_{y1}$ denotes the refractive index at the fast axis of the first phase delay layer 120, and $n_{z1}$ denotes a refractive index in a direction perpendicular to the slow and fast axes of the first phase delay layer 120.

In an embodiment, the first phase delay layer 120 may include an elongated polymer layer having a positive or negative birefringence value. The first phase delay layer 120 may include, for example, cycloolefin, poly(meth)acrylate, polycarbonate, polystyrene, polymaleimide, polyacrylonitrile, polyethylene terephthalate, cellulose, a mixture thereof, a polymer thereof, a copolymer thereof, or a combination thereof, but is not limited thereto.

The first phase delay layer 120 may include a liquid crystal having a positive or negative birefringence value. The liquid crystal may be an anisotropic liquid crystal, for example, a monomer, an oligomer, or a polymer having a rigid-rod shape.

In an embodiment, where the second phase delay layer 130 is a λ/4 phase delay layer, the second phase delay layer 130 may have in-plane retardation ($R_{e2}$) in a range of about 110 nm to about 160 nm for incident light in the reference wavelength. In one embodiment, for example, the second phase delay layer 130 may have in-plane retardation ($R_{e2}$) in a range of about 120 nm to about 150 nm. Herein, the in-plane retardation ($R_{e2}$) of the second phase delay layer 130 satisfies the following equation: $R_{e2}=(n_{x2}-n_{y2})\times d_2$, where $d_2$ denotes a thickness of the second phase delay layer 130, $n_{x2}$ denotes a refractive index at a slow axis of the second phase delay layer 130, and $n_{y2}$ denotes a refractive index at a fast axis of the second phase delay layer 130.

In an embodiment, where the second phase delay layer 130 is a λ/2 phase delay layer, the second phase delay layer 130 may have in-plane retardation ($R_{e1}$) in a range of about 240 nm to about 300 nm for incident light of the reference wavelength. In one embodiment, for example, the second phase delay layer 130 may have in-plane retardation ($R_{e1}$) in a range of about 250 nm to about 280 nm.

Referring to FIG. 3, an embodiment of the second phase delay layer 130 may include, for example, a substrate 131, an alignment layer 132 disposed on the substrate 131 and a liquid crystal layer 133 disposed on the alignment layer 132.

In an embodiment, the substrate 131 may include, for example, a glass substrate or a polymer substrate. In an embodiment, where the substrate 131 includes the polymer substrate, the polymer substrate may include or be made of, for example, polyethylene terephthalate ("PET"), PVA, polycarbonate ("PC"), triacetyl cellulose ("TAC"), a derivative thereof, and/or a combination thereof, but is not limited thereto. In an alternative embodiment, the alignment layer 132 and the liquid crystal layer 133 of the second phase delay layer 130 may be disposed on another lower layer, e.g., the first phase delay layer 120 or the polarizer 110 shown in FIG. 1. In such an embodiment, the substrate 131 may be omitted. In an embodiment, a surface (e.g., a lower surface) of the substrate 131 may contact the first phase delay layer 120 or the polarizer 110.

The alignment layer 132 may align a plurality of liquid crystals of the liquid crystal layer 133 to have a pretilt angle and thus control alignment of the liquid crystals, and for example, may include or be formed of polyvinyl alcohol, polyolefin, polyamic acid, polyimide, or a combination thereof. The surface of the alignment layer 132 may have a plurality of grooves defined or formed through a physical treatment such as rubbing on the surface or a photo-treatment such as photo-alignment.

The liquid crystal layer 133 may include the plurality of liquid crystals 133a oriented in a direction tilting obliquely with respect to a surface thereof (e.g., a surface of the liquid crystal layer 133 adjacent to the alignment layer 132). Herein, the obliquely tilting with respect to the surface of the liquid crystal layer 133 means that the liquid crystals are not vertically or horizontally aligned with a length (or width) direction of the liquid crystal layer 133, and each liquid crystal 133a is tilted at an angle of greater than about zero degree (0°) to less than about 90° with the surface of the liquid crystal layer 133.

In an embodiment, an angle at which each of the liquid crystals 133a is tilted with a respect to the surface of the liquid crystal layer 133 (hereinafter, referred to be as 'a tilt angle') may change along the thickness direction of the liquid crystal layer 133. The tilt angle of the liquid crystals 133a may be set based on a position of the liquid crystals 133a along the thickness direction in the liquid crystal layer 133. In one embodiment, for example, the tilt angle of the liquid crystals 133a may gradually change (e.g., increase or decrease) along the thickness direction of the liquid crystal layer 133, that is, the tilt angle of the liquid crystals 133a may gradually change as the position of the liquid crystals 133a in the thickness direction of the liquid crystal layer 133 changes.

In one embodiment, for example, when the liquid crystal layer 133 has a first surface that contacts the alignment layer 132 (e.g., a lower surface) and a second surface contacting the first phase delay layer 120 or the polarizer 110, the tilt angle of the liquid crystals 133a may become gradually increased from the first surface to the second surface, as shown in FIG. 2.

In one embodiment, for example, the tilt angle ($\theta_1$) of the liquid crystals 133a at (or adjacent to) the first surface may be a pretilt angle defined by the alignment layer 132. In such an embodiment, for example, the tilt angle ($\theta_1$) of the liquid crystals 133a at the first surface may be greater than about zero degree (0°) and less than or equal to about 20°. The tilt angle ($\theta_1$) of the liquid crystals 133a at the first surface may be, for example, from greater than about 0° to less than or equal to about 15°, for example, from greater than about 0° to less than or equal to about 10°, for example, from greater than about 0° to less than or equal to about 5°, or for example, in a range of about 2° to about 5°.

The tilt angle ($\theta_2$) of the liquid crystals 133a at (or adjacent to) the second surface may be a maximum tilt angle, which is in a range of about 30° to about 75°, for example. In one embodiment, for example, the maximum tilt angle may be, for example, in a range of about 35° to about 70°, or in a range of about 40° to about 60°.

In an embodiment, the liquid crystal layer 133 includes the plurality of liquid crystals 133a oriented in a direction tilting obliquely, and the tilt angle of the liquid crystals 133a is changed along the thickness direction of the liquid crystal layer 133, such that circularly-polarized light effect is substantially uniformly realized in all directions, and external light is effectively prevented from being reflected at a side as well as a front, thereby improving side visibility.

The liquid crystal 133a may have a rod shaped material aligned in a predetermined direction, and may include, for example, a monomer, an oligomer or a polymer. The liquid crystal 133a may have, for example, positive or negative birefringence ($\Delta n$).

The liquid crystals 133a may include a reactive mesogen liquid crystal, and may include, for example, at least one mesogenic moiety and at least one polymerizable functional group. The reactive mesogen liquid crystal may include at least one of, for example, a rod-shaped aromatic derivative having at least one reactive cross-linking group, propylene glycol 1-methyl, propylene glycol 2-acetate, and a compound represented by $P^1$-$A^1$-$(Z^1$-$A^2)_n$-$P^2$. Here, $P^1$ and $P^2$ independently include a polymerizationic functional group such as acrylate, methacrylate, acryloyl, vinyl, vinyloxy, epoxy or a combination thereof, $A^1$ and $A^2$ independently include 1,4-phenylene, naphthalene-2,6-diyl group or a combination thereof, $Z^1$ includes a single bond, —COO—, —OCO— or a combination thereof, and n is 0, 1 or 2, but is not limited thereto.

The liquid crystals 133a may include a thermosetting liquid crystal or a photocurable liquid crystal. In one embodiment, for example, the liquid crystals 133a may be a photocurable liquid crystal. In such an embodiment, where the liquid crystal 133a is a photocurable liquid crystal, the liquid crystal 133a may be curable by ultraviolet rays having a wavelength in a range from about 250 nm to about 400 nm.

In an embodiment, the in-plane retardation value (hereinafter, referred to be as 'in-plane retardation') of the liquid crystal layer 133 may be substantially the same as the in-plane retardation ($R_{e2}$) of the second phase delay layer 130 described above, and in-plane retardation ($R_{e2}$) for incident light having 450 nm, 550 nm and 650 nm wavelengths may satisfy the following Relationships 1 and 2.

$$0.95 \leq R_{e2}(450\ nm)/R_{e2}(550\ nm) \quad \text{[Relationship 1]}$$

$$0.95 \leq R_{e2}(550\ nm)/R_{e2}(650\ nm) \quad \text{[Relationship 2]}$$

In Relationships 1 and 2, $R_{e2}$ (450 nm) denotes in-plane retardation of the liquid crystal layer 133 for incident light of about 450 nm wavelength, $R_{e2}$ (550 nm) denotes in-plane retardation of the liquid crystal layer 133 for incident light of about 550 nm wavelength, and $R_{e2}$ (650 nm) denotes in-plane retardation of the liquid crystal layer 133 for incident light of about 650 nm wavelength.

In an embodiment, short wavelength dispersion of the liquid crystal layer 133 may satisfy the following Relationship 3.

$$1.0 \leq R_{e2}(450\ nm)/R_{e2}(550\ nm) \leq 1.2 \quad \text{[Relationship 3]}$$

In Relationship 3, $R_{e0}$ (450 nm) denotes in-plane retardation of the liquid crystal layer 133 for incident light of about 450 nm wavelength, and $R_{e0}$ (550 nm) denotes in-plane retardation of the liquid crystal layer 133 for incident light of about 550 nm wavelength.

The liquid crystal layer 133 may include a single kind of liquid crystal 133a or a plurality of kinds of liquid crystal 133a.

The liquid crystal layer 133 may include or be formed of a composition including the liquid crystal 133a, and the composition may include various additives, such as a reaction initiator, a surfactant, a dissolution assistant and/or a dispersing agent, and a solvent, other than the liquid crystal 133a. The composition may be applied through a solution process, for example, spin coating, slit coating or inkjet coating, to provide the liquid crystal layer 133, and the thickness of the liquid crystal layer 133 may be adjusted in consideration of a refractive index and the like.

In an embodiment, as described above, one of the first phase delay layer 120 and the second phase delay layer 130 may be a λ/2 phase delay layer, and the other of the first phase delay layer 120 and the second phase delay layer 130 may be a λ/4 phase delay layer. Accordingly, the first phase delay layer 120 and the second phase delay layer 130 are combined at a predetermined angle such that the combined first and second delay layer 120 and 130 may function as a circular polarization layer. When an angle of an optical axis of the first phase delay layer 120 for the reference angle is defined as $\theta_a$, an angle of an optical axis of the second phase delay layer 130 for the reference angle is defined as $\theta_b$, $\theta_a$ and $\theta_b$ satisfy the following relationship: $\theta_b=2\theta_a+45°$, such that the optical film may convert a linear polarized light into a circularly polarized light. Herein, the reference angle may be an angle of the optical axis of the polarizer, and the optical axis of the polarizer may be an absorption axis or a transmissive axis.

In one embodiment, for example, the slow axes of the first phase delay layer 120 and the second phase delay layer 130 may be combined to satisfy the following equation: $\theta_b=2\theta_a+45°$. In one embodiment, for example, when an angle between the optical axis of the polarizer 110 and the first phase delay layer 120 may be about 15°, the first phase delay layer 120 and the second phase delay layer 130 may be combined at about 60°, that is, an angle between the optical axis of the first phase delay layer 120 and the second phase delay layer 130 may be 60°. In one embodiment, for example, when an angle between the optical axis of the polarizer 110 and the first phase delay layer 120 is about 10°, the first phase delay layer 120 and the second phase delay layer 130 may be combined at about 55°. In one embodiment, for example, when an angle between the optical axis of the polarizer 110 and the first phase delay layer 120 is about 20°, the first phase delay layer 120 and the second phase delay layer 130 may be combined at about 65°.

In such an embodiment, the first phase delay layer 120 and the second phase delay layer 130 are combined at a predetermined angle to collectively define a circular polarization layer, and thereby external light reflectance at a front may be effectively prevented, and front visibility is substantially improved.

In such an embodiment, as described above, the first phase delay layer 120 and/or the second phase delay layer 130 includes a liquid crystal layer 133 including a plurality of liquid crystal 133a oriented in a direction tilting with respect to the surface of the liquid crystal layer 133, the tilt angles of liquid crystals 133a are changed along the thickness direction of the liquid crystal layer 133, and accordingly circularly-polarized light effect is substantially uniformly realized in all directions. Therefore, external light is effectively prevented from reflection at the side (e.g., left or right side) as well as the front, thereby substantially improving side visibility.

The combination (e.g., a combined layer) of the first phase delay layer 120 and the second phase delay layer 130 may have reverse wavelength dispersion phase delay. The reverse wavelength dispersion phase delay has higher retardation to light having a long wavelength than retardation to light having a short wavelength. In one embodiment, for example, in-plane retardation ($R_e$) of the combination of the first phase delay layer 120 and the second phase delay layer 130 for a 450 nm, 550 nm and 650 nm wavelengths may satisfy the following Relationship 4.

$$R_{e0}(450 \text{ nm}) \le R_{e0}(550 \text{ nm}) \le R_{e0}(650 \text{ nm}) \quad \text{[Relationship 4]}$$

In Relationship 4, $R_{e0}$ (450 nm) denotes in-plane retardation of the combination of the first phase delay layer 120 and the second phase delay layer 130 for incident light of about 450 nm wavelength, $R_{e0}$ (550 nm) denotes in-plane retardation of the combination of the first phase delay layer 120 and the second phase delay layer 130 for incident light of about 550 nm wavelength, and $R_{e0}$ (650 nm) denotes in-plane retardation of the combination of the first phase delay layer 120 and the second phase delay layer 130 for incident light of about 650 nm wavelength.

In one embodiment, for example, the wavelength dispersion of the combination of the first phase delay layer 120 and the second phase delay layer 130 may satisfy the following Relationship 5.

$$0.7 \le R_{e0}(450 \text{ nm})/R_{e0}(550 \text{ nm}) \le 1.0 \quad \text{[Relationship 5]}$$

In Relationship 5, $R_e$ (450 nm) denotes in-plane retardation of the combination of the first phase delay layer 120 and the second phase delay layer 130 for incident light of about 450 nm wavelength, and $R_e$ (550 nm) denotes in-plane retardation of the combination of the first phase delay layer 120 and the second phase delay layer 130 for incident light of about 550 nm wavelength.

In one embodiment, for example, the wavelength dispersion of the combination of the first phase delay layer 120 and the second phase delay layer 130 may satisfy the following Relationship 5a.

$$0.72 \le R_{e0}(450 \text{ nm})/R_{e0}(550 \text{ nm}) \le 0.92 \quad \text{[Relationship 5a]}$$

In one embodiment, for example, the wavelength dispersion of the combination of the first phase delay layer 120 and the second phase delay layer 130 may satisfy the following Relationship 5b.

$$0.80 \le R_{e0}(450 \text{ nm})/R_{e0}(550 \text{ nm}) \le 0.85 \quad \text{[Relationship 5b]}$$

The antireflection film 100 in FIG. 1 may further include an adhesion layer (not shown) at between the polarizer 110 and the second phase delay layer 130, or between the first phase delay layer 120 and the second phase delay layer 130. The antireflection film 100 in FIG. 2 may further include an adhesion layer (not shown) at between the polarizer 110 and the first phase delay layer 120, or between the first phase delay layer 120 and the second phase delay layer 130. The adhesion layer allow the polarizer 110, the first phase delay layer 120 and/or the second phase delay layer 130 to be effectively combined with each other or attached to each other. In such an embodiment, the adhesion layer may include or be made of, for example, a pressure sensitive adhesive.

The antireflection film 100 may further include a protective layer (not shown) disposed on a surface of the polarizer 110. The protective layer may reinforce the functionality or improve the durability of the antireflection film 100, or reduce reflection or glare. In one embodiment, for example, the protective layer may include a triacetyl cellulose ("TAC") film, but is not limited thereto.

The antireflection film 100 may further include a correction layer (not shown) disposed on a surface of the first phase delay layer 120 or the second phase delay layer 130. The correction layer may include, for example, a color shift resistant layer, but is not limited thereto.

The antireflection film 100 may further include a light blocking layer (not shown) extending along the edge. The light blocking layer may extend along the circumference of the antireflection film 100. The light-blocking layer may include an opaque material, for example, a black ink.

The antireflection film 100 may be provided by sequentially stacking the polarizer 110, the second phase delay layer 130 and the first phase delay layer 120 or the polarizer 110, the first phase delay layer 120 and the second phase delay layer 130 by a roll-to-roll method, but is not limited thereto.

Figure 4:
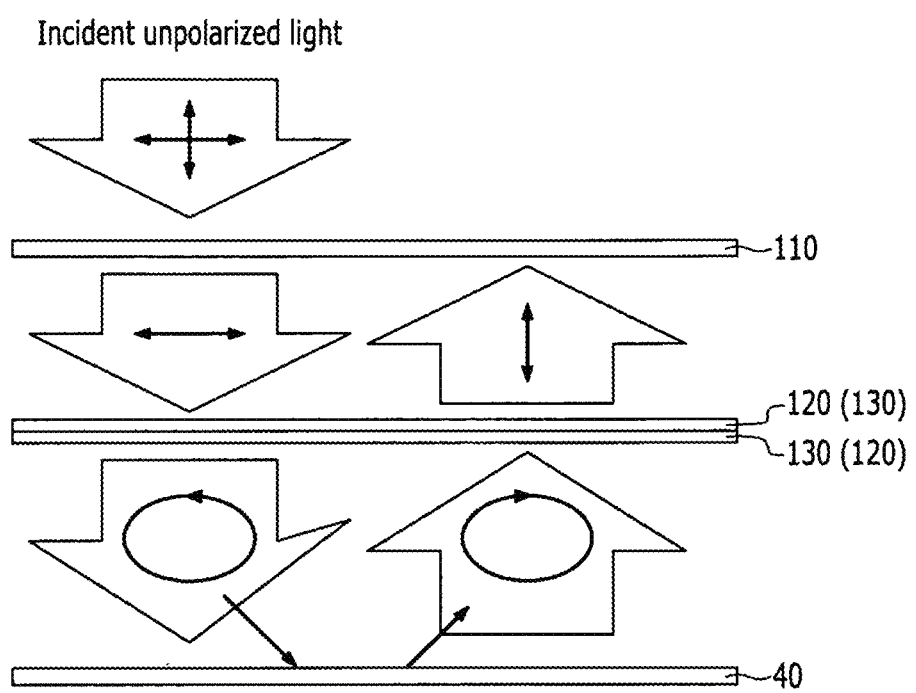
FIG. 4 is a schematic view showing the antireflection principle of an embodiment of an antireflection film.

FIG. 4 is a schematic view showing the external light antireflection principle of an embodiment of an antireflection film.

Referring to FIG. 4, while the incident unpolarized light having entered from the outside (hereinafter referred to be as 'external light') is passed through the polarizer 110, only a first polarized perpendicular component of the external light, which is one polarized perpendicular component of two polarized perpendicular components, is transmitted, and the polarized light is shifted into circularly polarized light by sequentially passing through the second phase delay layer 130 and the first phase delay layer 120 or the first phase delay layer 120 and the second phase delay layer 130. While the circularly polarized light is reflected in a display panel 40 including a substrate, an electrode and so on, and changes the circular polarization direction, and the circularly polarized light is sequentially passed through the first phase delay layer 120 and the second phase delay layer 130 or the second phase delay layer 130 and the first phase delay layer 120, only a second polarized perpendicular component, which is the other polarized perpendicular component of the two polarized perpendicular components, may be transmitted. As the second polarized perpendicular component is blocked or not allowed to pass through the polarizer 110, and light does not exit to the outside, effects of preventing the external light reflection may be provided.

Figure 5:
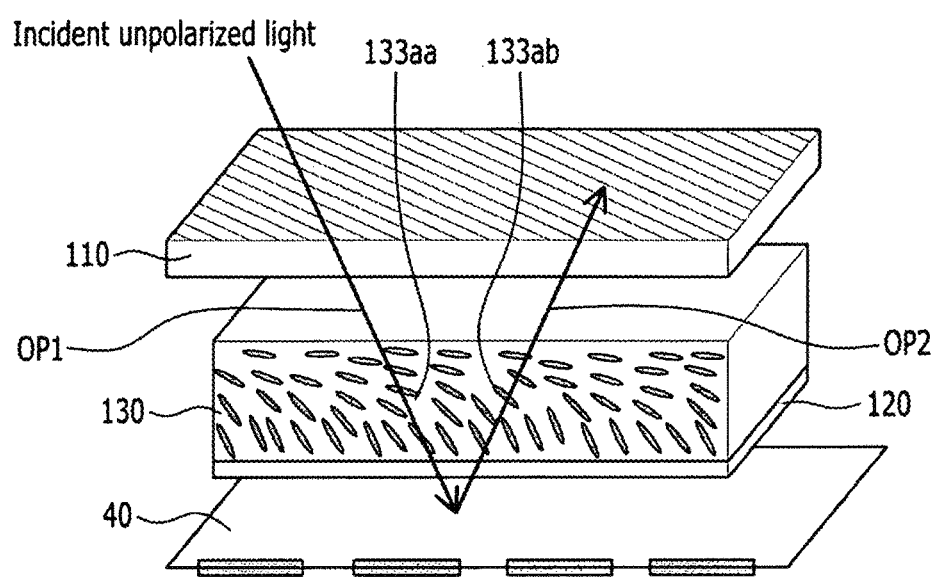
FIG. 5 is a schematic view showing viewing angle improvement principle of an embodiment of an antireflection film.

FIG. 5 is a schematic view showing a viewing angle improvement principle of an embodiment of an antireflection film in FIG. 1.

Referring to FIG. 5, when the external light travels along a first optical path OP1, in which the light passes through the second phase delay layer 130 and the first phase delay layer 120, and reaches the display panel 40, and then along a second optical path OP2, in which the light is reflected from the display panel 40 and re-passed through the first phase delay layer 120 and the second phase delay layer 130, and the light has a polarization direction that is changed through the first and second optical paths OP1 and OP2 and does not pass through the polarizer 110, showing an external light antireflection effect.

Herein, the first and second optical paths OP1 and OP2 may substantially form a mirror image with respect to the display panel 40. Accordingly, the second phase delay layer 130 includes liquid crystals that are tilted and aligned in one direction, but when external light sequentially passes the first optical path OP1 and the second optical path OP2 having opposite directions from each other, a phase difference may be adjusted by summing the slope alignment of liquid crystals 133*aa* in the first optical path OP1 and the slope alignment of liquid crystals 133*ab* in the second optical path OP2. Accordingly, in such an embodiment, an antireflection effect may be substantially equivalent in all directions, and a color shift due to reflection of external light at the side as well as the front may be effectively prevented, thereby improving side visibility.

The side visibility may be expressed as reflectance and a color shift at the side. In one exemplary embodiment, for example, the reflectance of the antireflection film at the side surface at 60° may be less than or equal to about 1.8%, e.g., less than or equal to about 1.5%, or less than or equal to about 1.2%.

Although FIG. 5 is shown a schematic view showing a viewing angle improvement principle of an embodiment of an antireflection film in FIG. 1, an antireflection film in FIG. 2 may be also applied to FIG. 5, instead of the antireflection film in FIG. 1.

Such an embodiment of the antireflection film 100 may be applied to an organic light emitting diode device.

Hereinafter, an embodiment of an organic light emitting diode device will be described in detail.

Figure 6:
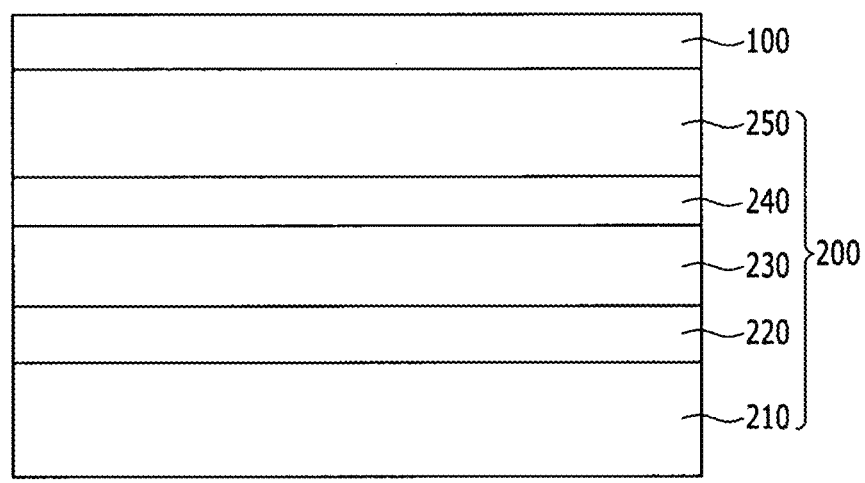
FIG. 6 is a schematic cross-sectional view of an embodiment of an organic light emitting diode device.

FIG. 6 is a cross-sectional view schematically showing an embodiment of an organic light emitting diode device.

Referring to FIG. 6, an embodiment of the organic light emitting diode device includes an organic light emitting display panel 200 and an antireflection film 100 disposed on a side or surface of the organic light emitting display panel 200.

The organic light emitting display panel 200 includes a base substrate 210, a lower electrode 220, an organic emission layer 230, an upper electrode 240, and an encapsulation substrate 250.

The base substrate 210 may include or be made of glass or plastic. In such an embodiment, one of the lower electrode 220 and the upper electrode 240 may be an anode, and the other of the lower electrode 220 and the upper electrode 240 may be a cathode. The anode is an electrode into which holes are injected and may include a conductive material having a high work function, and the cathode is an electrode into which electrons are injected and may include a conductive material having a low work function. At least one of the lower electrode 220 and the upper electrode 240 may include or be made of a transparent conductive material that allows light emitted thereto to pass therethrough, for example, indium tin oxide ("ITO") or indium zinc oxide ("IZO").

The organic emission layer 230 includes an organic material which may emit light when a voltage is applied to the lower electrode 220 and the upper electrode 240.

In an embodiment, the lower electrode 220, the organic emission layer 230 and the upper electrode 240 may have a microcavity structure. In such an embodiment, one of the lower electrode 220 and the upper electrode 240 is a transflective electrode, and the other of the lower electrode 220 and the upper electrode 240 is a reflecting electrode. In such an embodiment, luminous efficiency may be improved due to the microcavity structure.

In an embodiment, an auxiliary layer (not shown) may be further disposed or provided between the lower electrode 220 and the organic emission layer 230 and between the upper electrode 240 and the organic emission layer 230. The auxiliary layer may include a hole transporting layer, a hole injecting layer, an electron injecting layer, and an electron transporting layer to balance electrons and holes, but is not limited thereto.

The encapsulation substrate 250 may include or be made of glass, metal or a polymer, for example, and may seal the lower electrode 220, the organic emission layer 230 and the upper electrode 240 to prevent moisture and/or oxygen inflow from the outside.

The antireflection film 100 may be disposed on a light emitting side of the organic light emitting display panel 200, from which light is emitted. In an embodiment, where the organic light emitting diode device has a bottom emission structure, in which light is emitted through a side or surface of the base substrate 210, the antireflection film 100 may be disposed on an exterior side or surface of the base substrate 210. In an alternative embodiment, where the organic light emitting diode device has a top emission structure, in which light is emitted through a side or surface of the encapsulation substrate 250, the antireflection film 100 may be disposed on an exterior side or surface of the encapsulation substrate 250.

In such an embodiment, the antireflection film 100 is substantially the same as an embodiment of the antireflection film described above, and any repetitive detailed description thereof will be omitted. In an embodiment, the first surface of the liquid crystal layer of the antireflection film 100 may be disposed closer to the polarizer than the organic light emitting display panel, and the second surface of the liquid crystal layer of the antireflection film 100 may be disposed closer to the organic light emitting display panel than the polarizer. In an embodiment, the first surface of the liquid crystal layer of the antireflection film 100 may be disposed closer to the organic light emitting display panel than the polarizer, and the second surface of the liquid crystal layer of the antireflection film 100 may be disposed closer to the polarizer than the organic light emitting display panel.

In such an embodiment, the antireflection film 100 may prevent external light from being reflected by a metal such as an electrode of the organic light emitting display panel 200 and emitted outside of the organic light emitting device, and thus improves display characteristics of the organic light emitting device.

In such an embodiment, the antireflection film 100 may not only show a substantially equivalent antireflection effect in all directions, but may also effectively prevent a color shift due to refection of external light at the side as well as the front as described above, and thus improve side visibility.

Hereinafter, embodiments will be described in greater detail with reference to examples. However, these examples are merely exemplary, and the invention is not limited thereto.

Manufacture of Antireflection Film

EXAMPLE 1

For a simulation evaluation, a polarizer, a $\lambda/4$ phase delay layer ($R_{e2}$=138 nm), a $\lambda/2$ phase delay layer ($R_{e1}$=275 nm), and a reflector are sequentially disposed, e.g., stacked, one on another. Herein, the $\lambda/4$ phase delay layer includes a liquid crystal layer including a plurality of liquid crystals having a tilt angle that is gradually changed between a lower tilt angle (a minimum tilt angle) of 3° and an upper tilt angle (a maximum tilt angle) of 60°. The polarizer is disposed to have an axis angle of 90°, the $\lambda/2$ phase delay layer is disposed at 75°, and the $\lambda/4$ phase delay layer is disposed at 15°.

EXAMPLE 2

For a simulation evaluation, a polarizer, a $\lambda/4$ phase delay layer ($R_{e2}$=124 nm), a $\lambda/2$ phase delay layer ($R_{e1}$=248 nm), and a reflector are sequentially disposed, e.g., stacked, one on another. Herein, the $\lambda/4$ phase delay layer includes a liquid crystal layer including a plurality of liquid crystals having a tilt angle that is gradually changed between a lower tilt angle (a minimum tilt angle) of 3° and an upper tilt angle (a maximum tilt angle) of 60°. The polarizer is disposed to have an axis angle of 90°, the $\lambda/2$ phase delay layer is disposed at 75°, and the $\lambda/4$ phase delay layer is disposed at 15°.

EXAMPLE 3

For a simulation evaluation, a polarizer, a $\lambda/4$ phase delay layer ($R_{e2}$=124 nm), a $\lambda/2$ phase delay layer ($R_{e1}$=248 nm), and a reflector are sequentially disposed, e.g., stacked, one on another. Herein, the $\lambda/4$ phase delay layer is configured to include a liquid crystal layer including a plurality of liquid crystals having a tilt angle that is gradually changed between a lower tilt angle (a minimum tilt angle) of 3° and an upper tilt angle (a maximum tilt angle) of 45°. The polarizer is disposed to have an axis angle of 90°, the $\lambda/2$ phase delay layer is disposed at 75°, and the $\lambda/4$ phase delay layer is disposed at 15°.

EXAMPLE 4

For a simulation evaluation, a polarizer, a $\lambda/4$ phase delay layer ($R_{e2}$=124 nm), a $\lambda/2$ phase delay layer ($R_{e1}$=248 nm), and a reflector are sequentially disposed, e.g., stacked, one on another. Herein, the $\lambda/4$ phase delay layer is configured to include a liquid crystal layer including a plurality of liquid crystals having a tilt angle that is gradually changed between a lower tilt angle (a minimum tilt angle) of 3° and an upper tilt angle (a maximum tilt angle) of 30°. The polarizer is disposed to have an axis angle of 90°, the $\lambda/2$ phase delay layer is disposed at 75°, and the $\lambda/4$ phase delay layer is disposed at 15°.

EXAMPLE 5

For a simulation evaluation, a polarizer, a $\lambda/4$ phase delay layer ($R_{e2}$=124 nm), a $\lambda/2$ phase delay layer ($R_{e1}$=248 nm), and a reflector are sequentially disposed, e.g., stacked, one on another. Herein, the $\lambda/4$ phase delay layer is configured to include a liquid crystal layer including a plurality of liquid crystals having a tilt angle that is gradually changed between a lower tilt angle (a minimum tilt angle) of 3° and an upper tilt angle (a maximum tilt angle) of 75°. The polarizer is disposed to have an axis angle of 90°, the $\lambda/2$ phase delay layer is disposed at 75°, and the $\lambda/4$ phase delay layer is disposed at 15°.

COMPARATIVE EXAMPLE 1

A simulation is performed according to the same method as Example 1, except that the $\lambda/4$ phase delay layer includes a plurality of liquid crystals having a tilt angle of zero degree (0°) (A plate).

COMPARATIVE EXAMPLE 2

A simulation is performed according to the same method as Example 2, except that the $\lambda/4$ phase delay layer includes a plurality of liquid crystals having a tilt angle of zero degree (0°) (A plate).

Evaluation

The reflectance of antireflection films Examples 1 to 5 and Comparative Examples 1 and 2 is evaluated from their fronts and sides.

The reflectance is evaluated using LCD Master equipment (Shintech Inc.).

Figure 7:
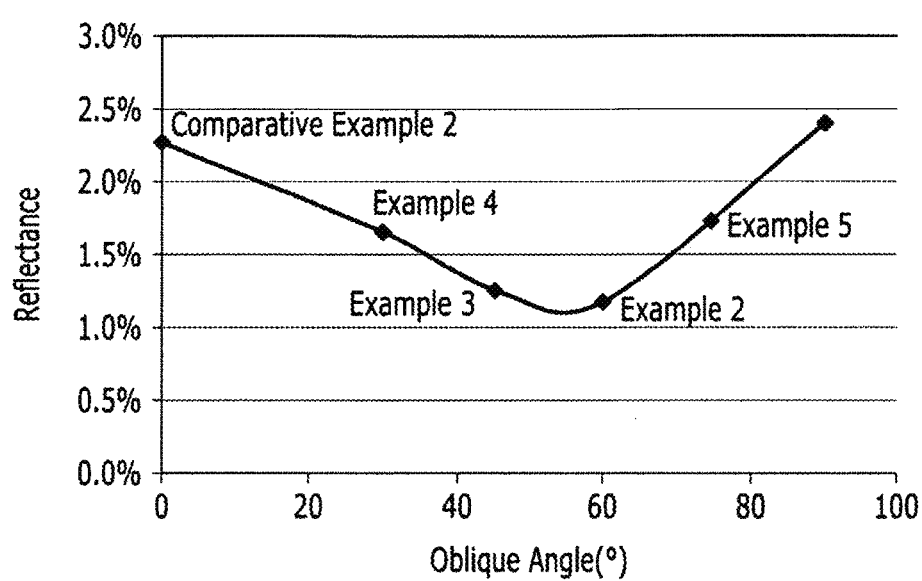
FIG. 7 is a graph showing relationship between a maximum tilt angle of a liquid crystal and reflectance at the side surface at 60° in antireflection films according to Examples 2 to 5 and Comparative Example 2.
Figure 8:
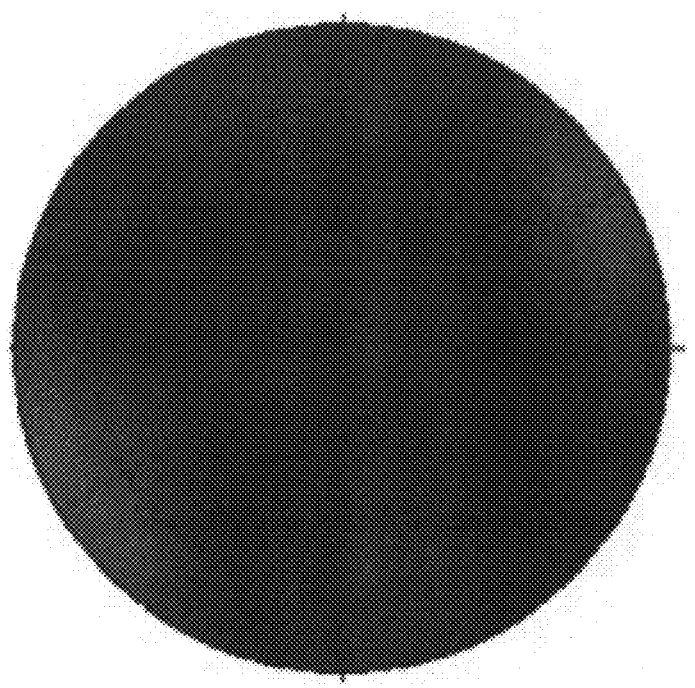
FIG. 8 shows a simulation result of reflectance depending on a viewing angle in all directions in an antireflection film according to Example 1.
Figure 9:
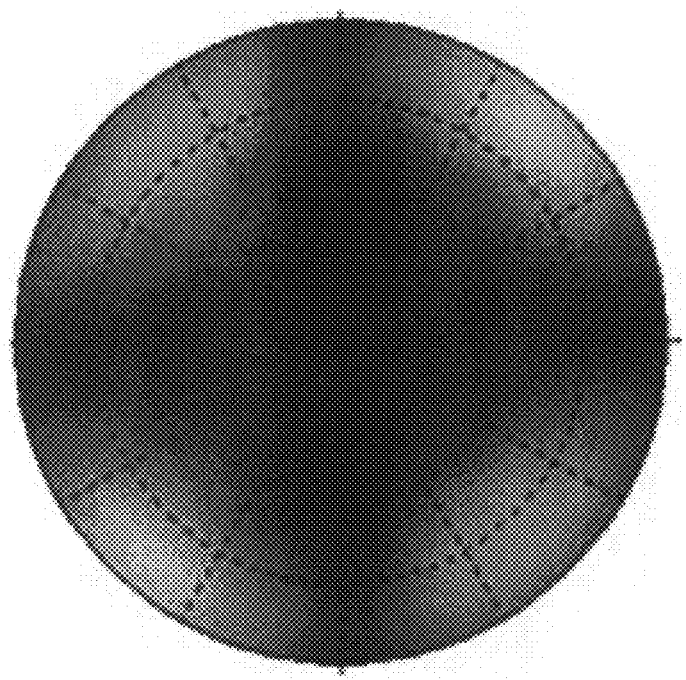
FIG. 9 shows a simulation result of reflectance depending on a viewing angle in all directions in an antireflection film according to Comparative Example 1.

The results are shown in Tables 1 and 2, and illustrated in FIGS. 7 to 9.

FIG. 7 is a graph showing a relationship between a maximum tilt angle of a liquid crystal and reflectance at the side surface at 60° in the antireflection films according to Examples 2 to 5 and Comparative Example 2, FIG. 8 shows a simulation result of reflectance depending on a viewing angle in all directions in the antireflection film according to Example 1, and FIG. 9 shows a simulation result of reflectance depending on a viewing angle in all directions in the antireflection film according to Comparative Example 1.

TABLE 1

|  | $R_{e1}$ λ/2 | $R_{e2}$ λ/4 | Tilt angle of liquid crystal | Front reflectance | Side 60° reflectance |
|---|---|---|---|---|---|
| Example 1 | 275 nm | 138 nm | 3-60° | 0.0% | 1.2% |
| Comparative Example 1 | 275 nm | 138 nm | 0° | 0.0% | 2.3% |

TABLE 2

|  | $R_{e1}$ λ/2 | $R_{e2}$ λ/4 | Tilt angle of liquid crystal | Front reflectance | Side 60° reflectance |
|---|---|---|---|---|---|
| Example 2 | 248 nm | 124 nm | 3-60° | 0.1% | 1.0% |
| Example 3 | 248 nm | 124 nm | 3-45° | 0.1% | 1.1% |
| Example 4 | 248 nm | 124 nm | 3-30° | 0.1% | 1.7% |
| Example 5 | 248 nm | 124 nm | 3-75° | 0.1% | 1.8% |
| Comparative Example 2 | 248 nm | 124 nm | 0° | 0.1% | 2.1% |

Referring to Table 1, the antireflection film of Example 1 shows substantially lower reflectance at a side at 60° compared with the antireflection film of Comparative Example 1. Referring to FIGS. 8 and 9, the antireflection film of Example 1 shows substantially decreased color shift at every angle compared with the antireflection film of Comparative Example 1.

Referring to Table 2 and FIG. 7, the antireflection films of Examples 2 to 5 show substantially lower reflectance at a side at 60° compared with the antireflection film of Comparative Example 2.

Accordingly, the antireflection films according to Examples 1 to 5 may be improved in terms of visibility.

While the disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An antireflection film comprising
a polarizer;
a first phase delay layer, the first phase delay layer being a λ/2 phase delay layer; and
a second phase delay layer, the second phase delay layer being a λ/4 phase delay layer,
wherein the second phase delay layer comprises a liquid crystal layer having a first surface and a second surface opposite to the first surface,
wherein the liquid crystal layer comprises liquid crystals oriented in a direction tilting obliquely with respect to a surface thereof,
tilt angles of the liquid crystals becomes gradually increased from the first surface to the second surface,
in-plane retardation ($R_{e0}$) of a combination of the first phase delay layer and the second phase delay layer for about 450 nm, about 550 nm and about 650 nm wavelengths satisfies the following inequation: $R_{e0}$ (450 nm)≤$R_{e0}$(550 nm)≤$R_{e0}$(650 nm),
wherein $R_{e0}$ (450 nm) denotes in-plane retardation of the combination of the first phase delay layer and the second phase delay layer for incident light of about 450 nm wavelength,
$R_{e0}$ (550 nm) denotes in-plane retardation of the combination of the first phase delay layer and the second phase delay layer for incident light of about 550 nm wavelength, and
$R_{e0}$ (650 nm) denotes in-plane retardation of the combination of the first phase delay layer and the second phase delay layer for incident light of about 650 nm wavelength.

2. The antireflection film of claim 1, wherein a maximum tilt angle of the liquid crystals is in a range from about 30 degrees to about 75 degrees.

3. The antireflection film of claim 1, wherein a tilt angle of the liquid crystals near the first surface is greater than about zero degree)(0°) and less than or equal to about 5 degrees.

4. The antireflection film of claim 3, wherein the second phase delay layer further comprises an alignment layer contacting the first surface of the liquid crystal layer.

5. The antireflection film of claim , wherein in-plane retardation ($R_{e2}$) of the liquid crystal layer for about 450 nm, about 550 nm and about 650 nm wavelengths satisfies the following inequations: 0.95 ≤$R_{e2}$(450 nm)/$R_{e2}$ (550 nm); and 0.95≤$R_{e2}$(550 nm)/$R_{e2}$(650 nm),
wherein
$R_{e2}$ (450 nm) denotes in-plane retardation of the liquid crystal layer for incident light of about 450 nm wavelength,
$R_{e2}$ (550 nm) denotes in-plane retardation the liquid crystal layer for incident light of about 550 nm wavelength, and
$R_{e2}$ (650 nm) denotes in-plane retardation of the liquid crystal layer for incident light of about 650 nm wavelength.

6. The antireflection film of claim , wherein the wavelength dispersion of the liquid crystal layer satisfies the following inequation: 1.0≤$R_{e2}$ (450 nm)/$R_{e2}$ (550 nm) ≤1.2,
Wherein $R_{e2}$ (450 nm) denotes in-plane retardation of the liquid crystal layer for incident light of about 450 nm wavelength, and $R_{e2}$ (550 nm) denotes in-plane retardation of the liquid crystal layer for incident light of about 550 nm wavelength.

7. The antireflection film of claim , wherein short wavelength dispersion of a combination of the first phase delay layer and the second phase delay layer satisfies the following inequation: 0.7≤$R_{e0}$(450 nm)/$R_{e0}$ (550 nm)≤1.0,
Wherein $R_{e0}$ (450 nm) denotes in-plane retardation of the combination of the first phase delay layer and the second phase delay layer for incident light of about 450 nm wavelength, and
$R_{e0}$ (550 nm) denotes in-plane retardation of the combination of the first phase delay layer and the second phase delay layer for incident light of about 550 nm wavelength.

8. The antireflection film of claim 1, wherein an angle ($\theta_a$) between an optical axis of the first phase delay layer and an optical axis of the polarizer and an angle ($\theta_b$) between an optical axis of the second phase delay layer and an optical axis of the polarizer satisfy the following equation: $\theta_b = 2\theta_a + 45°$.

9. The antireflection film of claim 1, wherein the first phase delay layer has refractive indices satisfying the following inequations: $n_{x1} > n_{y1}$;
and $n_{x1} \leq n_{z1}$,
Wherein $n_{x1}$ denotes a refractive index at a slow axis of the first phase delay layer,
$n_{y1}$ denotes a refractive index at a fast axis of the first phase delay layer, and
$n_{z1}$ denotes a refractive index in a direction perpendicular to the slow and fast axes of the first phase delay layer.

10. The antireflection film of claim 9, wherein the first phase delay layer comprises an elongated polymer layer.

11. The antireflection film of claim 1, wherein the antireflection film comprises the polarizer, the first phase delay layer disposed on the polarizer, and the second phase delay layer disposed between the polarizer and the first phase delay layer.

12. The antireflection film of claim 1, wherein the antireflection film comprises the polarizer, the first phase delay layer, and the second phase delay stacked sequentially.

13. An organic light emitting diode device comprising:
an organic light emitting display panel; and
an antireflection film on the organic light emitting display panel, the antireflection film comprising:
a polarizer;
a first phase delay layer, the first phase delay layer being a $\lambda/2$ phase delay layer; and
a second phase delay layer, the second phase delay layer being a $\lambda/4$ phase delay layer,
wherein the second phase delay layer comprises a liquid crystal layer having a first surface and a second surface opposite to the first surface, and
the liquid crystal layer comprises liquid crystals oriented in a direction tilting obliquely with respect to a surface thereof,
tilt angles of the liquid crystals becomes gradually increased from the first surface to the second surface,
in-plane retardation ($R_{e0}$) of a combination of the first phase delay layer and the second phase delay layer for about 450 nm, about 550 nm and about 650 nm wavelengths satisfies the following inequation: $R_{e0}$ (450 nm)≤$R_{e0}$(550 nm)≤$R_{e0}$(650 nm),
wherein $R_{e0}$ (450 nm) denotes in-plane retardation of the combination of the first phase delay layer and the second phase delay layer for incident light of about 450 nm wavelength,
$R_{e0}$ (550 nm) denotes in-plane retardation of the combination of the first phase delay layer and the second phase delay layer for incident light of about 550 nm wavelength, and
$R_{e0}$ (650 nm) denotes in-plane retardation of the combination of the first phase delay layer and the second phase delay layer for incident light of about 650 nm wavelength.

14. The organic light emitting diode device of claim 13 wherein
the first surface of the liquid crystal layer is disposed closer to the polarizer than the organic light emitting display panel, and
the second surface of the liquid crystal layer is disposed closer to the organic light emitting display panel than the polarizer.

15. The organic light emitting diode device of claim 13, wherein a maximum tilt angle of the liquid crystals is in a range from about 30 degrees to about 75 degrees.

16. The organic light emitting diode device of claim 13, wherein a tilt angle of the liquid crystals near the first surface is greater than about zero degree(0°) and less than or equal to about 5 degrees.

17. The organic light emitting diode device of claim 13, wherein the second phase delay layer further comprises an alignment layer contacting the first surface of the liquid crystal layer.

18. The organic light emitting diode device of claim 13, wherein in-plane retardation ($R_{e2}$) of the liquid crystal layer for about 450 nm, about 550 nm, and about 650 nm wavelengths satisfies the following inequations: 0.95≤$R_{e2}$ (450 nm)/$R_{e2}$ (550 nm); and 0.95≤$R_{e2}$ (550 nm)/$R_{e2}$ (650 nm),
wherein $R_{e2}$ (450 nm) denotes in-plane retardation of the liquid crystal layer for incident light of about 450 nm wavelength,
$R_{e2}$ (550 nm) denotes in-plane retardation the liquid crystal layer for incident light of about 550 nm wavelength, and
$R_{e2}$ (650 nm) denotes in-plane retardation of the liquid crystal layer for incident light of about 650 nm wavelength.

19. The organic light emitting diode device of claim 13, wherein wavelength dispersion of the liquid crystal layer satisfies the following inequation: 1.0≤$R_{e2}$(450 nm)/$R_{e2}$(550 nm)≤1.2,
Wherein $R_{e2}$ (450nm) denotes in-plane retardation of the liquid crystal layer for incident light of about 450nm wavelength, and
$R_{e2}$ (550 nm) denotes in-plane retardation of the liquid crystal layer for incident light of about 550 nm wavelength.

20. The organic light emitting diode device of claim 13, wherein short wavelength dispersion of a combination of the first phase delay layer and the second phase delay layer satisfies the following inequation: 0.7≤$R_{e0}$(450 nm)/$R_{e0}$(550 nm)≤1.0,
Wherein $R_{e0}$ (450 nm) denotes in-plane retardation of the combination of the first phase delay layer and the second phase delay layer for incident light of about 450 nm wavelength, and
$R_{e0}$ (550 nm) denotes in-plane retardation of the combination of the first phase delay layer and the second phase delay layer for incident light of about 550 nm wavelength.

21. The organic light emitting diode device of claim 13, wherein an angle ($\theta_a$) between an optical axis of the first phase delay layer and an optical axis of the polarizer and an angle ($\theta_b$) between an optical axis of the second phase delay layer and an optical axis of the polarizer satisfy the following equation: $\theta_b = 2\theta_a + 45°$.

22. The organic light emitting diode device of claim 13, wherein the first phase delay layer has a refractive index that simultaneously satisfies the following inequations: $n_{x1} > n_{y1}$; and $n_{x1} > n_{z1}$
wherein
$n_{x1}$ denotes a refractive index at a slow axis of the first phase delay layer,
$n_{y1}$ denotes a refractive index at a fast axis of the first phase delay layer, and
$n_{z1}$ denotes a refractive index in a direction perpendicular to the slow and fast axes of the first phase delay layer.

23. The organic light emitting diode device of claim 13, wherein the first phase delay layer comprises an elongated polymer layer.

24. The organic light emitting diode device of claim 13, wherein the antireflection film comprises the polarizer, the first phase delay layer disposed on the polarizer, and the second phase delay layer disposed between the polarizer and the first phase delay layer.

25. The organic light emitting diode device of claim 13, wherein the antireflection film comprises the polarizer, the first phase delay layer, and the second phase delay stacked sequentially.

* * * * *